(12) United States Patent
Pfirsch et al.

(10) Patent No.: US 10,950,690 B2
(45) Date of Patent: Mar. 16, 2021

(54) POWER ELECTRONIC ARRANGEMENT

(71) Applicant: Infineon Technologies AG, Neubiberg (DE)

(72) Inventors: Frank Dieter Pfirsch, Munich (DE); Thomas Basler, Ottenhofen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/431,337

(22) Filed: Jun. 4, 2019

(65) Prior Publication Data

US 2019/0386093 A1 Dec. 19, 2019

(30) Foreign Application Priority Data

Jun. 15, 2018 (DE) .......................... 102018114375.3

(51) Int. Cl.
*H01L 29/06* (2006.01)
*H01L 29/16* (2006.01)
(Continued)

(52) U.S. Cl.
CPC ...... *H01L 29/0626* (2013.01); *H01L 29/0696* (2013.01); *H01L 29/1608* (2013.01);
(Continued)

(58) Field of Classification Search
CPC ............. H01L 29/0626; H01L 29/0696; H01L 29/7412; H01L 29/7808; H01L 29/742;
(Continued)

(56) References Cited

U.S. PATENT DOCUMENTS 5,861,639 A * 1/1999 Bernier ............... H01L 29/7404
257/112
2001/0043111 A1* 11/2001 Gonthier .............. H03K 17/305
327/531
(Continued)

FOREIGN PATENT DOCUMENTS

| DE | 102014226161 A1 | 7/2016 | |
| EP | 1017103 A1 * | 7/2000 | ......... H01L 27/0635 |
| WO | 2013127787 A1 | 9/2013 | |

OTHER PUBLICATIONS

Takesuye et al. Introduction to Insulated Gate Bipolar Transistors. Littelfuse, Inc. Publication AN1541/D, Sep. 19, 2016, pp. 1-6 (Year: 2016).*

(Continued)

*Primary Examiner* — Galina G Yushina
(74) *Attorney, Agent, or Firm* — Murphy, Bilak & Homiller, PLLC

(57) ABSTRACT

A power electronic arrangement includes a semiconductor switch structure configured to assume a forward conducting state. A steady-state current carrying capability of the semiconductor switch structure in the forward conducting state is characterized by a nominal current. The semiconductor switch structure is configured to conduct, in the forward conducting state, at least a part of a forward current in a forward current mode of the power electronic arrangement. A diode structure electrically connected in antiparallel to the semiconductor switch structure is configured to conduct at least a part of a reverse current in a reverse mode of the power electronic arrangement. A thyristor structure electrically connected in antiparallel to the semiconductor switch structure has a forward breakover voltage lower than a diode on-state voltage of the diode structure at a critical diode current value, the critical diode current value amounting to at most five times the nominal current.

37 Claims, 11 Drawing Sheets

(51) Int. Cl.
*H01L 29/739* (2006.01)
*H01L 29/866* (2006.01)
*H01L 29/74* (2006.01)
*H01L 29/78* (2006.01)
*H01L 25/18* (2006.01)
*H01L 29/08* (2006.01)

(52) U.S. Cl.
CPC ........ *H01L 29/7397* (2013.01); *H01L 29/742* (2013.01); *H01L 29/7412* (2013.01); *H01L 29/7803* (2013.01); *H01L 29/7805* (2013.01); *H01L 29/7808* (2013.01); *H01L 29/866* (2013.01); *H01L 25/18* (2013.01); *H01L 29/0804* (2013.01); *H01L 29/0839* (2013.01)

(58) Field of Classification Search
CPC ............. H01L 29/7805; H01L 29/7803; H01L 29/1608; H01L 29/7397; H01L 29/866; H01L 29/0804; H01L 29/0839; H01L 29/749; H01L 29/74; H01L 25/18; H01L 27/0635; H01L 27/0647
See application file for complete search history.

(56) References Cited

U.S. PATENT DOCUMENTS

2004/0144992 A1* 7/2004 Willmeroth ......... H01L 29/7395
                                                           257/107
2010/0027174 A1   2/2010 Galy et al.
2018/0138169 A1*  5/2018 Reiter ................. H01L 29/0834
2018/0323777 A1* 11/2018 Vershinin ................. H02J 3/36

OTHER PUBLICATIONS

Floyd et al. Thyristors, Pearson Education, NJ, 07458, pp. 1-51 (Year: 2012).*

* cited by examiner

POWER ELECTRONIC ARRANGEMENT

TECHNICAL FIELD

This specification refers to embodiments of a power electronic arrangement and to embodiments of a power electronic module comprising a plurality of such power electronic arrangements. In particular, this specification relates to embodiments of a power electronic arrangement comprising a semiconductor switch, a diode structure, and a reverse-conducting structure and to embodiments of a power electronic module comprising a plurality of such power electronic arrangements.

BACKGROUND

Many functions of modern devices in automotive, consumer and industrial applications, such as converting electrical energy and driving an electric motor or an electric machine, rely on power electronic arrangements comprising semiconductor devices. For example, power electronic arrangements comprising insulated gate bipolar transistors (IGBTs), thyristors, metal oxide semiconductor field effect transistors (MOSFETs) and diodes, to name a few, have been used for various applications including, but not limited to switches in power drives, power supplies and power converters.

Frequently, such a power electronic arrangement comprises a semiconductor switch, e. g., an IGBT, and a diode connected in antiparallel thereto, wherein the diode may function, for example, as free-wheeling diode. Such a power electronic arrangement may be operated in a forward mode, wherein the semiconductor switch conducts at least a part of a forward current, and in a reverse mode, wherein the diode conducts at least a part of a reverse current.

In certain operating conditions, such as, e. g., a pulse blocking mode of the switch after failure detection, a load current has to flow through the diode, requiring a relatively high surge current capability of the diode. For example, a sufficient surge current capability may be ensured by providing a relatively large active area of the diode. However, this is generally at the expense of higher switching losses.

In certain applications, e. g., High voltage direct current (HVDC) applications, extra devices, such as thyristors, are sometimes provided for surge current events. While this solution may allow for a full optimization of the diodes without surge current constraints, it is generally expensive due to the need for, e. g., a dedicated control board for igniting the thyristor.

It is thus generally desirable to enable a high surge current capability of a power electronic arrangement while at the same time allowing for an optimization of electrical properties with regard to normal operation modes of the power electronic arrangement.

SUMMARY

According to an embodiment, a power electronic arrangement is configured for conducting a forward current in a forward mode of the power electronic arrangement and for conducting a reverse current in a reverse mode of the power electronic arrangement. The power electronic arrangement comprises: a semiconductor switch structure being configured for assuming a forward conducting state, wherein a steady-state current carrying capability of the semiconductor switch structure in the forward conducting state is characterized by a nominal current, and wherein the semiconductor switch structure is configured for conducting, in the forward conducting state, at least a part of the forward current in the forward current mode of the power electronic arrangement; a diode structure being electrically connected in antiparallel to the semiconductor switch structure and being configured for conducting at least a part of the reverse current in the reverse mode of the power electronic arrangement; and a reverse-conducting structure being monolithically integrated with the semiconductor switch structure. In the reverse mode of the power electronic arrangement, the reverse-conducting structure conducts less than 10% of the reverse current if the amount of the reverse current is equal to or smaller than a first critical reverse current value, the first critical reverse current value amounting to at least the nominal current. Further, in the reverse mode, the reverse-conducting structure conducts at least 20% of the reverse current if the amount of the reverse current is equal to or larger than a second critical reverse current value, the second critical reverse current value amounting to at most 10 times the nominal current.

According to another embodiment, a power electronic arrangement is configured for conducting a forward current in a forward mode of the power electronic arrangement and for conducting a reverse current in a reverse mode of the power electronic arrangement. The power electronic arrangement comprises: a semiconductor switch structure being configured for assuming a forward conducting state, wherein a steady-state current carrying capability of the semiconductor switch structure in the forward conducting state is characterized by a nominal current, and wherein the semiconductor switch structure is configured for conducting, in the forward conducting state, at least a part of the forward current in the forward current mode of the power electronic arrangement; a diode structure being electrically connected in antiparallel to the semiconductor switch structure and being configured for conducting at least a part of the reverse current in the reverse mode of the power electronic arrangement; and a thyristor structure being electrically connected in antiparallel to the semiconductor switch structure, wherein a forward breakover voltage of the thyristor structure is lower than a diode on-state voltage VFO of the diode structure at a critical diode current value, wherein the critical diode current value amounts to at most five times the nominal current.

According to a further embodiment, a power electronic module comprises a plurality of such power electronic arrangements, wherein the sum of active areas of the diode structures is in a range from 10% to 60% of the sum of active areas of the semiconductor switch structures.

Those skilled in the art will recognize additional features and advantages upon reading the following detailed description, and upon viewing the accompanying drawings.

BRIEF DESCRIPTION OF THE DRAWINGS

The parts in the Figures are not necessarily to scale, emphasis being instead placed upon illustrating principles of the invention. Moreover, in the Figures, like reference numerals designate corresponding parts. In the drawings.

DETAILED DESCRIPTION

Figure 1:
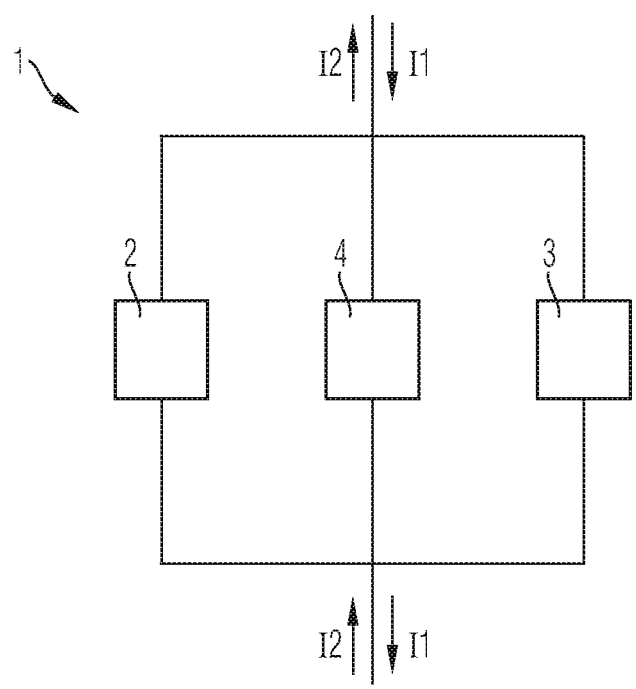
FIG. 1 schematically and exemplarily illustrates a power electronic arrangement in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the Figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e. g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e. g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e. g., by means of an insulation, e. g., a dielectric.

Specific embodiments described in this specification pertain to, without being limited thereto, a power semiconductor device exhibiting a stripe cell or needle cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power unit cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e. g., up to several ten or hundred Ampere or even up to some kA, and/or high voltages, typically above 100 V, more typically 500 V and above, e. g., up to at least 1 kV, up to at least more 3 kV. For example, the semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e. g., storing data, computing data and/or other types of semiconductor based data processing.

FIG. 1 schematically and exemplarily illustrates a power electronic arrangement 1 in accordance with one or more embodiments. The power electronic arrangement 1 is configured for being operated in a forward mode, wherein it conducts a forward current I1, and in a reverse mode, wherein it conducts a reverse current I2 in a direction opposite to the forward current I1. The power electronic arrangement 1 comprises a semiconductor switch structure 2, a diode structure 3, and a reverse-conducting structure 4, which are electrically connected with each other in a parallel or antiparallel configuration.

The semiconductor switch structure 2 is configured for assuming a forward conducting state, in which it conducts at least a part of the forward current I1 flowing through the power electronic arrangement 1. For example, in an embodiment, the semiconductor switch structure 2 is or comprises an IGBT, such as a silicon-based IGBT. In another exemplary embodiment, the semiconductor switch structure 2 is or comprises a MOSFET, such as, e. g., a silicon or silicon carbide based MOSFET. It may also be, in an embodiment, a HEMT based on e.g. III/V-semiconductors as e.g. GaN.

The semiconductor switch structure 2 may have a nominal current Inom. For example, the nominal current Inom may be a rated nominal current, e. g., according to a marking code and/or datasheet associated with the semiconductor switch structure 2. The nominal current Inom may characterize a steady-state current carrying capability of the semiconductor switch structure 2 in its forward conducting state. The person skilled in the art is aware of common ways of defining a nominal current in dependence on, e. g., thermal properties of a semiconductor switching device, which may limit a steady state current carrying capability.

For example, the semiconductor switch structure 2 may comprise a semiconductor body including a pn-junction that may be configured for blocking a forward blocking voltage of the semiconductor switch structure in a forward blocking state of the semiconductor switch structure 2. The semiconductor body may be encased by a case. Further, the semiconductor switch structure 2 may have a junction-case thermal resistance Rthjc characterizing a steady-state heat transport capability between the pn-junction and the case. For example, the junction-case thermal resistance Rthjc may be a rated junction case thermal resistance, e. g., according to a datasheet associated with the semiconductor switch structure 2.

Further, the semiconductor switch structure 2 may be configured for being operated continuously in the forward conducting state at a maximum junction temperature Tjmax of the pn-junction and a maximum operating case temperature Tc of the case. For example, the maximum junction temperature Tjmax may be a rated maximum junction temperature, e. g., according to a datasheet associated with the semiconductor switch structure 2. In an embodiment, the maximum junction temperature Tjmax is at least 150° C., or such as at least 175° C. For example, the maximum junction temperature Tjmax may be 175° C. The maximum operating case temperature Tc may be a rated maximum operating case temperature Tc, e. g., according to a datasheet associated with the semiconductor switch structure 2. For example, in an embodiment, the maximum operating case temperature Tc may be at most 100°, such as at most 80° C. The maximum operating case temperature Tc is lower than the maximum junction temperature Tjmax. For example, a difference between the maximum junction temperature and the maximum operating case temperature may be at least 50 K. In an exemplary embodiment, the maximum operating case temperature Tc is at most 100° C. and the maximum junction temperature Tjmax is at least 150° C.

The operation of the semiconductor switch structure 2 in the forward conducting state at the maximum junction temperature Tjmax may be characterized by a switch-structure on-state voltage Von. For example, in case the semiconductor switch structure 2 is or comprises an IGBT, the switch-structure on-state voltage may be a collector-emitter voltage of the IGBT. As another example, in case the semiconductor switch structure 2 is or comprises a MOSFET, the switch-structure on-state voltage may be a source-drain voltage of the MOSFET. The nominal current Inom may satisfy the following equation:

$$Von \cdot Inom = \frac{Tjmax - Tc}{Rthjc}$$

In other words, the nominal current Inom may, for example, be defined as a maximal allowable current that allows for a steady state power dissipation when the semiconductor switch structure is operated at the maximum junction temperature. However, it should be noted that datasheet ratings of the above characteristic quantities (Von, Inom, Tjmax, Tc, Rthjc) usually include safety margins. Thus, a nominal current as rated in a datasheet may be lower than a nominal current as calculated from the above equation, in particular, if actual measured quantities are used, e. g., for the switch-structure on-state voltage Von and/or for the junction-case thermal resistance. On the other hand, the case temperature Tc in the above equation may be lower than the maximum operating case temperature.

The diode structure 3 of the power electronic arrangement is electrically connected in antiparallel to the semiconductor switch structure 2. This is to say that a forward direction of the diode structure 3 (as determined, e. g., by a pn-junction included in the diode structure 2) is directed opposite to a forward direction of the semiconductor switch structure 2, i.e., opposite to the direction in which the semiconductor switch structure 2 conducts a current in its forward conducting state. The diode structure 3 may thus be configured for conducting at least a part of the reverse current in the reverse mode of the power electronic arrangement 1. For example, the diode structure 3 may function as a free-wheeling diode during operation of the power electronic arrangement 1.

For example, the diode structure 3 is or comprises a power diode, such as a silicon or silicon carbide diode. In an embodiment, as described in more detail below, the diode structure 3 may be provided separate from the semiconductor switch structure 2, e. g., on a separate chip and/or as a separate device. In another embodiment, as also described in more detail below, the diode structure 3 may be monolithically integrated with the semiconductor switch structure 2. For example, in an embodiment, wherein the power electronic arrangement comprises a MOSFET (such as a silicon carbide MOSFET), a body diode of the MOSFET may form at least a part of the diode structure 3.

The reverse-conducting structure 4 of the power electronic arrangement 1 may be configured for conducting a part of the reverse current 2 depending on an operating condition of the power electronic arrangement 1, e. g., depending on the amount of the reverse current I2. For example, under normal operating conditions, the reverse-conducting structure 4 may conduct no reverse current or only a relatively small part of the reverse current I2 in the reverse mode. Under different operating conditions, such as, e. g., a surge current condition in the reverse mode, the reverse-conducting structure 4 may conduct a considerably larger part of the reverse current I2.

For example, in an embodiment, the reverse-conducting structure 4 conducts less than 10% of the reverse current I2 if the amount of the reverse current I2 is equal to or smaller than a first critical reverse current value IRC1, wherein the first critical reverse current value IRC1 amounts to at least twice the nominal current Inom, such as, e. g., at least three times the nominal current Inom. Further, the reverse-conducting structure 4 may conduct at least 20% of the reverse current I2 or even at least 40% of the reverse current I2 if the amount of the reverse current I2 is equal to or larger than a second critical reverse current value IRC2, wherein the second critical reverse current value IRC2 amounts to at most 10 times, such as, e. g., at most 5 times the nominal current Inom.

In an embodiment, the reverse-conducting structure 4 comprises a Zener diode. In other embodiments, as will be explained in more detail below, the reverse-conducting structure 4 comprises a thyristor structure 40 that may or may not be monolithically integrated with the semiconductor switch structure 2. The thyristor structure 40 may be electrically connected in antiparallel to the semiconductor switch structure 2. This is to say that a forward direction of the thyristor structure 40 (as determined, e. g., by an npnp-sequence of semiconductor regions included in the thyristor structure 2) may be directed opposite to a forward direction of the semiconductor switch structure 2, i.e., opposite to the direction in which the semiconductor switch structure 2 conducts a current in its forward conducting state. The forward direction of the thyristor structure 40 may also be characterized as the direction that is associated with a blocking mode as well as a (forward) conducting mode, whereas the opposite direction is associated only with a (reverse) blocking mode of the thyristor structure 40. The reverse-conducting structure 4 may or may not be monolithically integrated with the semiconductor switch structure 2, as will be explained in the following with reference to exemplary embodiments.

Figure 2:
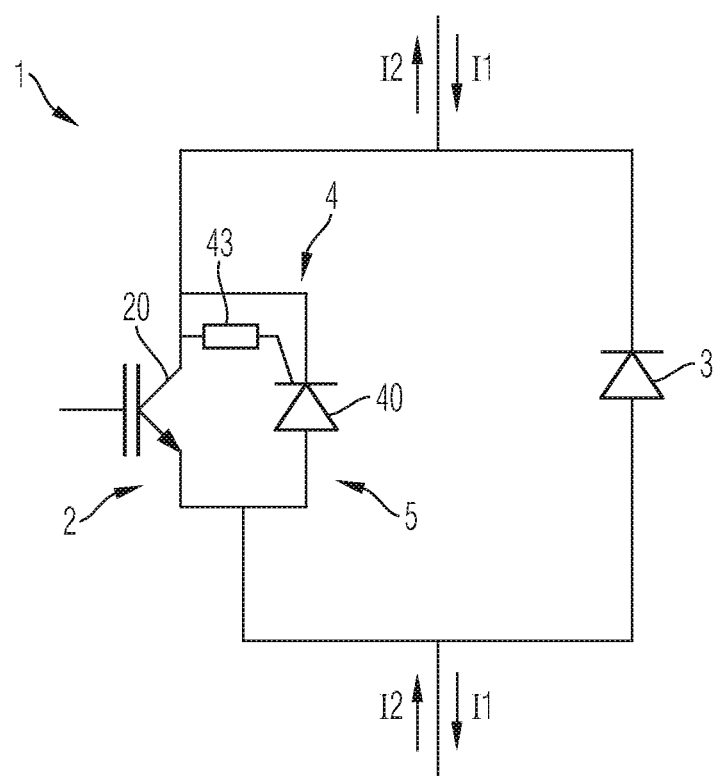
FIG. 2 schematically and exemplarily illustrates a power electronic arrangement comprising a power semiconductor device in accordance with one or more embodiments.

FIG. 2 schematically and exemplarily illustrates a power semiconductor arrangement in accordance with one or more embodiments, wherein the semiconductor switch structure is an IGBT 20 and the reverse-conducting structure 4 is provided in the form of a thyristor structure 40. The IGBT 20 and the thyristor structure 40 are monolithically integrated in a power semiconductor device 5. The left branch of the circuit diagram in FIG. 2 illustrates an equivalent circuit of the power semiconductor device 5. Those skilled in the art are acquainted with the symbols used in FIG. 2 for the IGBT 20, the thyristor structure 40, and the diode 3. For example, in FIG. 2, the resistor 43 may correspond to an ohmic connection between a p-base of the thyristor structure 40 and a p-collector of the IGBT 20 (cf. backside collector region 102 in FIG. 3A).

Figure 3A:
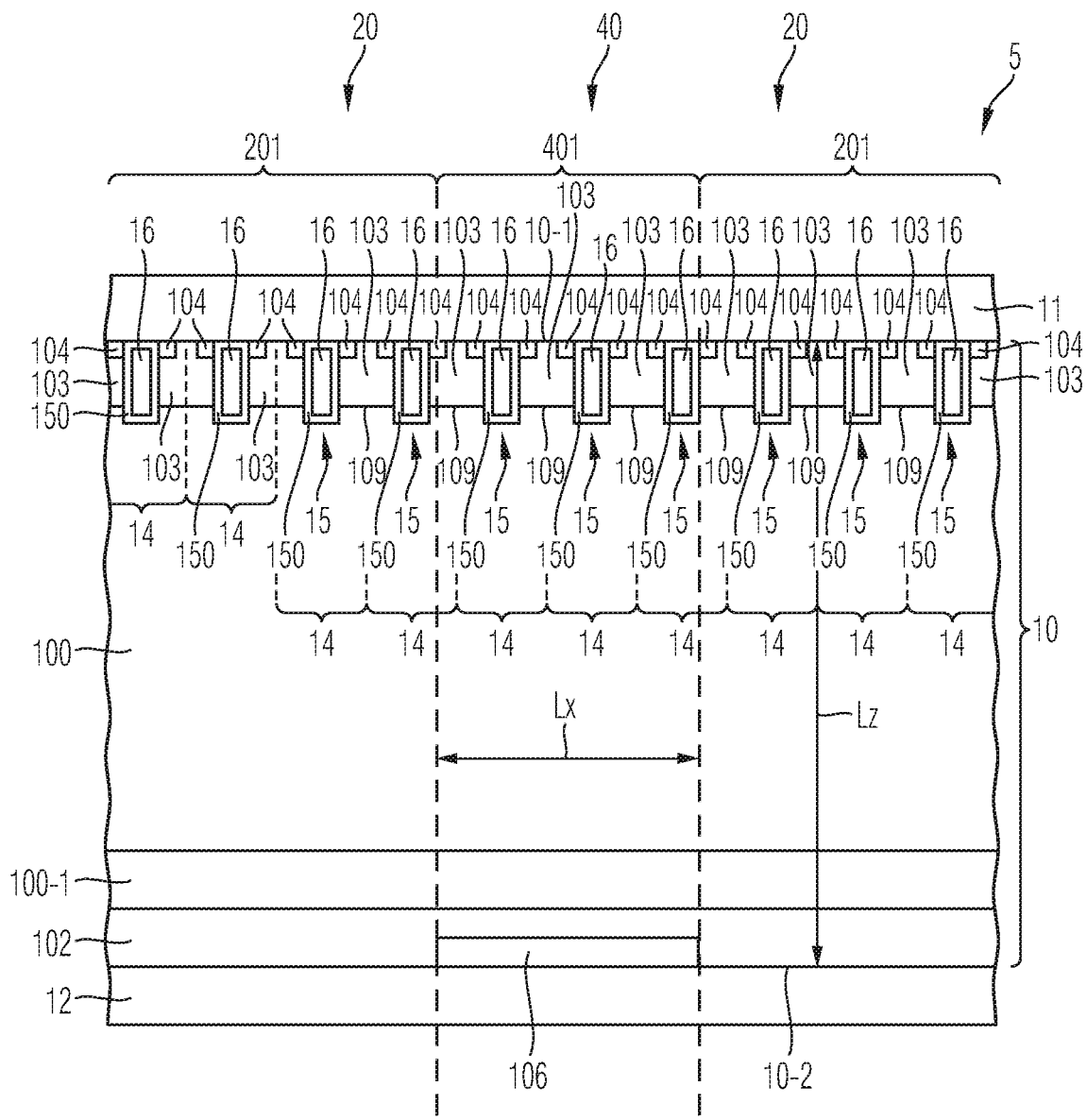
FIG. 3A schematically and exemplarily illustrates a section of a vertical cross-section of the power semiconductor device in FIG. 2 in accordance with one or more embodiments.
Figure 3B:
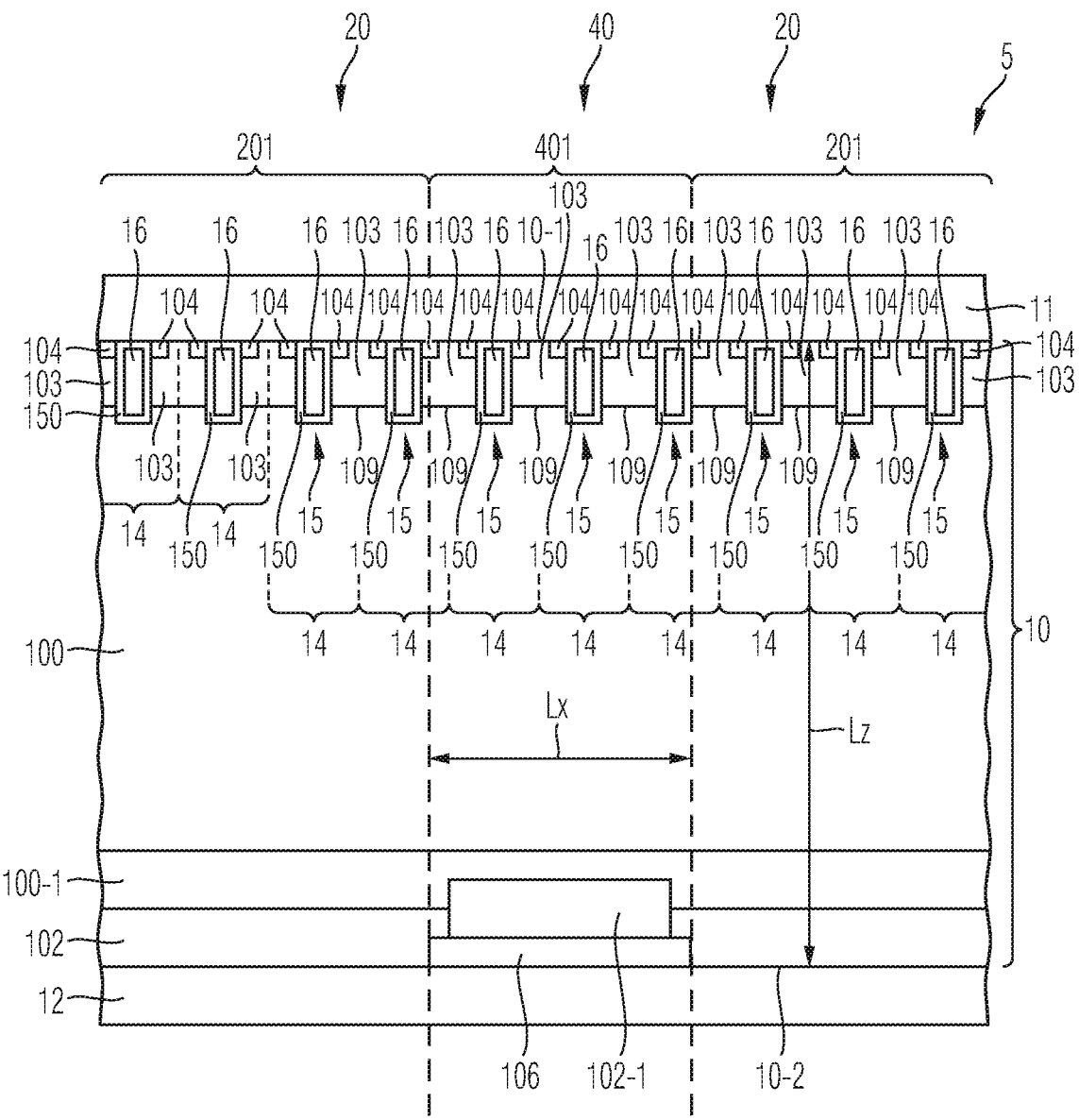
FIG. 3B schematically and exemplarily illustrates a section of a vertical cross-section of the power semiconductor device in FIG. 2 in accordance with one or more embodiments.
Figure 3C:
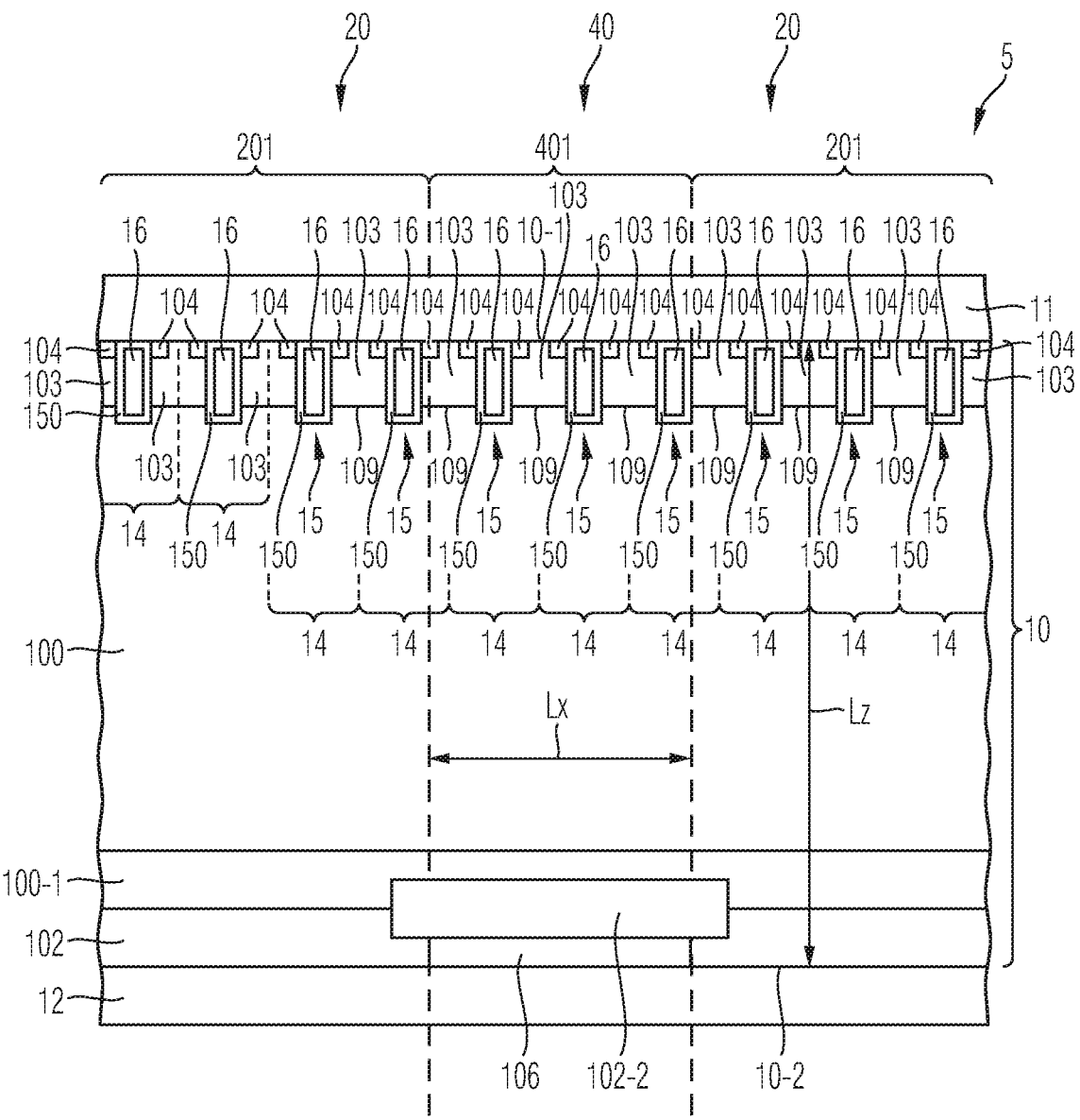
FIG. 3C schematically and exemplarily illustrates a section of a vertical cross-section of the power semiconductor device in FIG. 2 in accordance with one or more embodiments.

FIGS. 3A-3C each illustrate sections of a vertical cross-section of the power semiconductor device 5 of FIG. 2 in accordance with one or more embodiments. The power semiconductor device 5 comprises a semiconductor body 10 having a front side 10-1 coupled to a first load terminal structure 11 and a backside 10-2 coupled to a second load terminal structure 12 and being configured for conducting at least a part of the forward current I1 between the second load terminal structure 12 and the first load terminal structure 11. For example, the first load terminal structure 11 may comprise a front side metallization, and the second load terminal structure 12 may comprise a backside metallization. The semiconductor body 10 comprises a drift region 100 of a first conductivity type (e. g., n-type). The drift region 100 may comprise a field stop region 100-1, wherein the field stop region 100-1 has dopants of the first conductivity type at a higher concentration than portions of the drift region 100 external of the field stop region 100-1. Further, a plurality of IGBT control cells 14 are arranged at the front side 10-1 in contact with the first load terminal structure 11, wherein the IGBT control cells 14 may be at least partially included in the semiconductor body 10. Each IGBT control cell 14 may, for example, comprise a gate trench comprising a gate electrode 16 and an insulation structure 150, at least one emitter region 104 of the first conductivity type, a body region 103 of a second conductivity type complementary to the first conductivity type, and a portion of the drift region 100. Further, a pn-junction 109 is formed at a transition between the body region 103 and the drift region 100. Configurations of such IGBT cells 14 are well known to the skilled person and will therefore not be explained in detail.

The semiconductor body 10 further comprises a backside collector region 102 of the second conductivity type (e. g., p-type), wherein the backside collector region 102 is arranged at the backside 10-2 in contact with the second load terminal structure 12. In addition, the semiconductor body 10 comprises a thyristor cathode region 106 of the first conductivity type (e. g., n⁺-type) that is arranged at the backside 10-2 in contact with the second load terminal structure 12. The thyristor cathode region 106 is isolated from the drift region 100 by a semiconductor region of the second conductivity type (e. g., p-type). For example, in the exemplary embodiment of FIG. 3A, a portion of the backside collector region 102 isolates the thyristor cathode region 106 from the drift region 100. In other embodiments, as illustrated in FIGS. 3B-C, there may be provided additional semiconductor regions 102-1, 102-2 of the second conductivity type for isolating the thyristor cathode region 106 from the drift region 100.

The npnp-stack (or, alternatively, pnpn-stack) of the thyristor cathode region 106, the semiconductor region 102, 102-1, 102-2 isolating the thyristor cathode region 106 from the drift region 100, the drift region 100, and the body region 103 may thus form a functional part of the thyristor structure 40 that is monolithically integrated with the IGBT 20 electrically connected in antiparallel thereto. For example, a lateral extension Lx of the thyristor cathode region 106 may define a thyristor region 401 of the semiconductor device 5. Correspondingly, regions where the thyristor cathode region 106 is absent, may define one or more IGBT regions 201. It should, however, be noted that IGBT control cells 14 may not only be arranged inside the IGBT 201 regions, but also in the thyristor region 401. In other words, in an embodiment, the thyristor cathode region 106 may exhibit a lateral overlap with the plurality of IGBT control cells 14. It should be noted that each of a forward breakover voltage Vfwbr, a holding voltage Vh, and a holding current Ih of the thyristor structure 40 may be adjusted by choosing a dopant concentration within the semiconductor region of the second conductivity type that isolates the thyristor cathode region 106 from the drift region 100. For example, each of the forward breakover voltage Vfwbr, the holding voltage Vh, and the holding current Ih may be decreased by decreasing the concentration of dopants of the second conductivity type in said semiconductor region, and vice versa.

For example, the lateral extension Lx may be equal to or smaller than twice a vertical extension Lz (i.e., a thickness) of the semiconductor body 10. It should be noted that each of the forward breakover voltage Vfwbr, the holding voltage Vh, and the holding current Ih of the thyristor structure 40 may also be adjusted by choosing an appropriate lateral extension Lx of the thyristor cathode region 106. For example, each of the forward breakover voltage Vfwbr, the holding voltage Vh, and the holding current Ih may be decreased by increasing the lateral extension Lx, and vice versa. Further, in an embodiment, the semiconductor body 10 comprises a plurality of such thyristor cathode regions 106 that are distributed over a lateral extension of the semiconductor body 10, thereby defining a plurality of such thyristor regions 401 (not illustrated in the section of the vertical cross-section depicted in FIGS. 3A-C).

Figure 4:
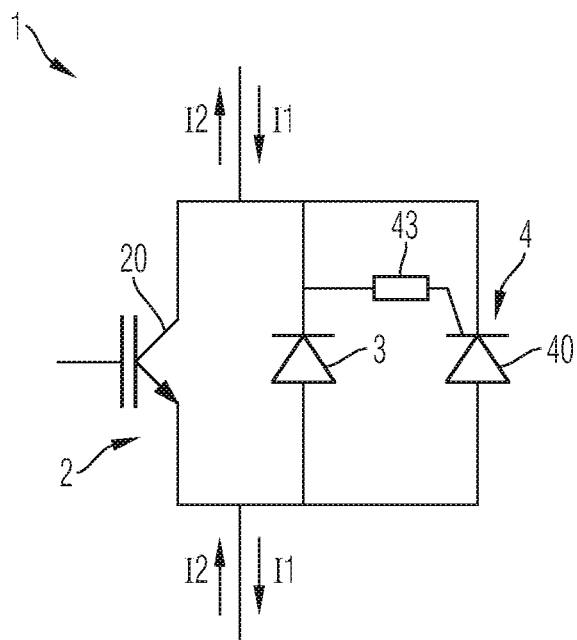
FIG. 4 schematically and exemplarily illustrates a power electronic arrangement in accordance with one or more embodiments.

FIG. 4 schematically and exemplarily illustrates another embodiment of the power electronic arrangement 1 of FIG. 1. In this example, the semiconductor switch structure 2 is provided in the form of an IGBT 20, such as, e. g., a silicon IGBT. A diode, such as a silicon carbide diode, is provided as the diode structure 3 of the power electronic arrangement 1. Further, the power electronic arrangement 1 comprises a thyristor 40. For example, the IGBT 20, the diode 3, and the thyristor 40 may be provided as separate devices, such as, on separate chips.

Figure 5:
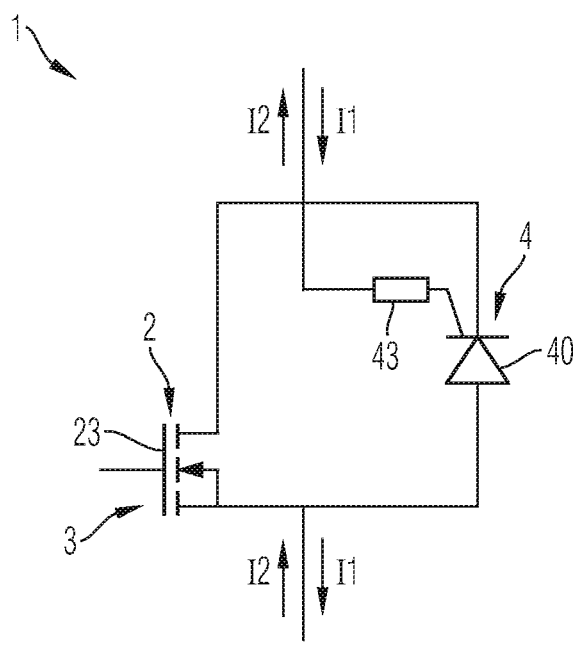
FIG. 5 schematically and exemplarily illustrates a power electronic arrangement in accordance with one or more embodiments.

FIG. 5 schematically and exemplarily illustrates yet another embodiment of a power electronic arrangement 1 in accordance with FIG. 1. In this exemplary embodiment, the semiconductor switch structure 2 and the diode structure 3 are combined in a MOSFET 23. For example, the MOSFET 23 is a silicon carbide MOSFET. For example, the diode structure 3 is provided by a body diode of the MOSFET 23. In such an arrangement, in the reverse mode of the power electronic arrangement 1, at least a part of the reverse current I2 may be carried by the body diode 3 of the MOSFET 23 or by the MOSFET itself with the channel turned on. Further, a thyristor 40 is provided, which may be arranged separately from the MOSFET 23, such as, on a separate chip.

In the following, the operation in the reverse mode of a power electronic arrangement 1, wherein the power electronic arrangement 1 comprises a thyristor structure 40 as described above, will be described with reference to FIGS. 6A-8.

Figure 6A:
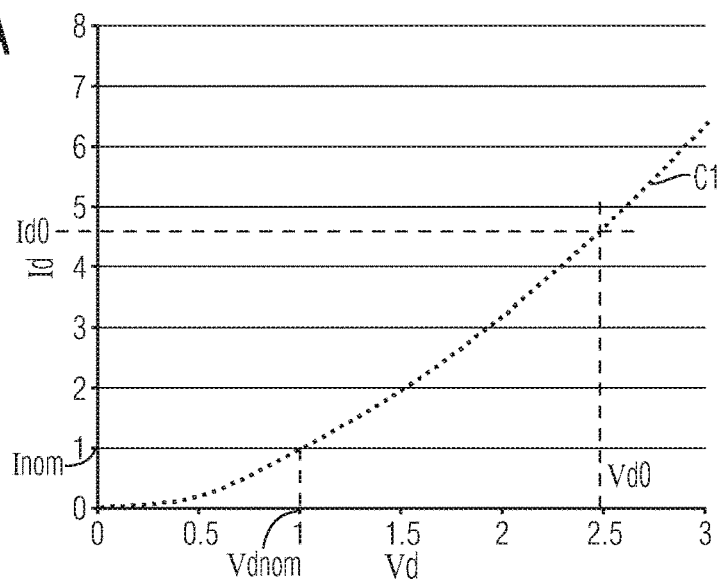
FIG. 6A schematically and exemplarily illustrates a diode structure current-voltage diagram in a reverse mode of a power electronic arrangement in accordance with one or more embodiments.

FIG. 6A illustrates a current-voltage curve C1 of the diode structure 3 in the reverse mode of the power electronic arrangement 1. The y-axis of the diagram in FIG. 6A shows diode current Id, wherein the scale of the y-axis is normalized to the amount of the nominal current Inom of the semiconductor switch structure 2. The x-axis shows the corresponding diode voltage Vd of the diode structure 3, i.e., the forward voltage Vd of the diode structure 3 in the reverse mode of the power electronic arrangement 1. The scale of the x-axis is normalized to a diode forward voltage Vdnom of the diode structure 3 at a diode current Id amounting to the nominal current Inom. The skilled person is generally acquainted with diode characteristics as shown in FIG. 6A.

Figure 6B:
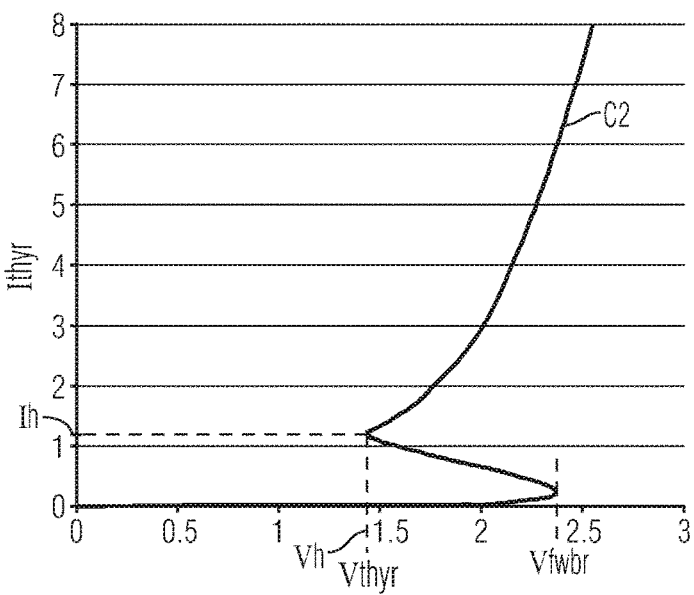
FIG. 6B schematically and exemplarily illustrates a thyristor structure current-voltage diagram in a reverse mode of a power electronic arrangement in accordance with one or more embodiments.

FIG. 6B illustrates a current voltage curve C2 of the thyristor structure 40 in the reverse mode of the power electronic arrangement 1. As in FIG. 6A, the y-axis of the diagram in FIG. 6B shows a thyristor current Ithyr in the reverse direction of the power electronic arrangement 1 (i.e., in a forward direction of the thyristor structure 40). The scale of the y-axis is normalized to the amount of the nominal current Inom of the semiconductor switch structure 2. The x-axis shows the corresponding voltage Vthyr of the thyristor structure 40 in the reverse mode of the power electronic arrangement. For ease of comparison, the scale of the x-axis is the same as in FIG. 6A, i.e., normalized to the diode forward voltage Vdnom. The current-voltage characteristic of FIG. 6B exhibits a characteristic snap-back at of the thyristor voltage Vthyr at a forward breakover voltage Vfwbr of the thyristor structure 40. For example, the thyristor structure 40 is ignited at the forward breakover voltage Vfwbr.

In an embodiment, the forward breakover voltage Vfwbr of the thyristor structure 40 may be lower than a diode on-state voltage Vd0 of the diode structure 3 at a critical diode current value Id0, wherein the critical diode current value Id0 amounts to at most five times the nominal current Inom. For example, in an embodiment, the forward breakover voltage Vfwbr is equal to or smaller than 10V, such as, e. g., equal to or smaller than 8V. Further, in an embodiment, the forward breakover voltage may amount to at least 3V.

The current voltage curve C2 as shown in FIG. 6B is further characterized by a holding voltage Vh of the thyristor structure 40. The skilled person is generally familiar with the concept of a holding voltage of a transistor. For example, the holding voltage Vh corresponds to a holding current Ih, which may be considered as the minimal required current for keeping the transistor in its ignited state (i.e., its on-state). In other words, when coming from higher currents and then dropping below the holding current Ih, the thyristor structure 40 switches off.

In an embodiment, as exemplarily illustrated in FIG. 6B, the holding voltage Vh of the thyristor structure 2 is higher than a diode forward voltage Vdnom of the diode structure 3 at the nominal current Inom.

Further, in an embodiment, as exemplarily illustrated in FIG. 6A, in the reverse mode of the power electronic arrangement 1, the diode structure 3 may be configured for conducting between the nominal current Inom and four times the nominal current Inom at a voltage equal to a holding voltage Vh of the thyristor structure 40.

Regarding further properties of the thyristor structure 40, in an embodiment, a reverse blocking voltage of the thyristor structure 40 may be higher than the forward breakover voltage Vfwbr. In case the thyristor structure 40 is monolithically integrated with an IGBT 20, as in the semiconductor device 5 described above with regard to FIGS. 2-3C, the reverse blocking voltage of the thyristor structure 40 needs to be defined with a closed gate of the IGBT cells 14, which may also be present in a transistor region 401 of the semiconductor device 5.

Further, in an embodiment, the reverse blocking voltage of the thyristor structure 40 may amounts to at least a rated breakdown voltage of the diode structure 3. For example, the reverse blocking voltage of the thyristor structure 40 may amount to at least 90% of an actual breakdown voltage of the diode structure 3.

Figure 6C:
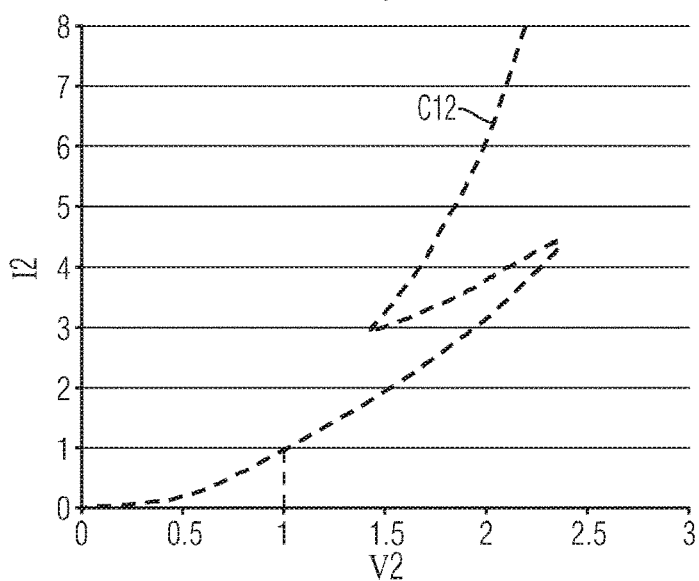
FIG. 6C schematically and exemplarily illustrates a current-voltage diagram in a reverse mode of a power electronic arrangement in accordance with one or more embodiments.
Figure 6D:
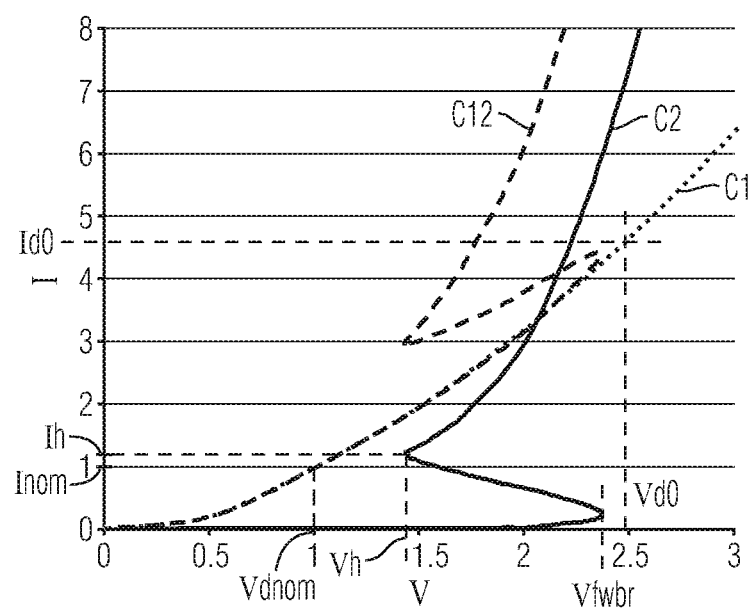
FIG. 6D shows the current-voltage curves of FIGS. 6A-C in one diagram.

FIG. 6C illustrates a current-voltage curve C12 corresponding to the sum of the current-voltage curves C1, C2 depicted in FIGS. 6A-B. Under the assumption that the semiconductor switch structure 2 itself does not carry a significant part of the reverse current, the sum C12 of the curves C1, C2 corresponds essentially to the reverse current I2. Therefore, in the diagram of FIG. 6C, the y-axis is labeled with I2. The x-axis shows the overall reverse voltage V2 of the power electronic arrangement 1, wherein, due to the parallel connection of the diode structure 2 and the thyristor structure 14, the reverse voltage V2 equals the diode voltage Vd and the thyristor voltage Vthyr. Again, the scale of the y-axis is normalized to the amount of the nominal current Inom, and the scale of the x-axis is the same as in FIGS. 6A-B. FIG. 6D shows the current-voltage curves C1, C2, C12 of FIGS. 6A-C in one diagram.

Figure 7A:
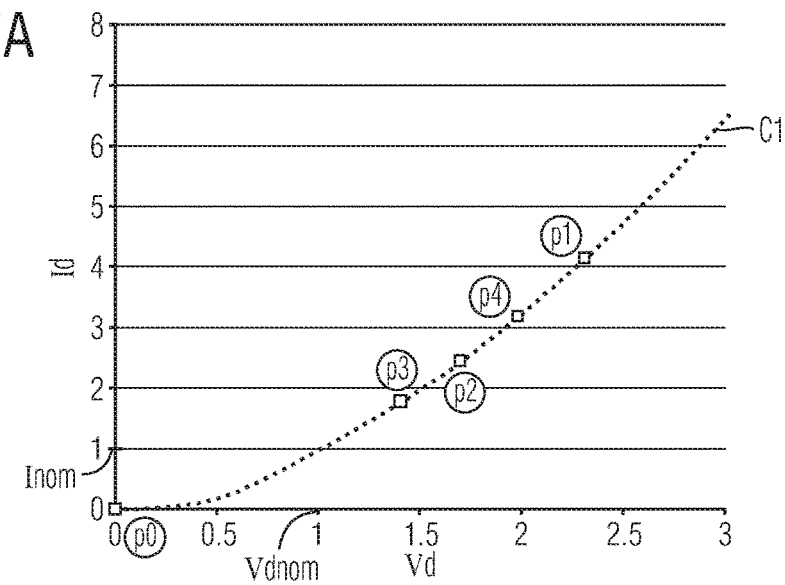
FIG. 7A schematically and exemplarily illustrates a hysteresis in the diode structure current-voltage diagram of FIG. 6A.
Figure 7B:
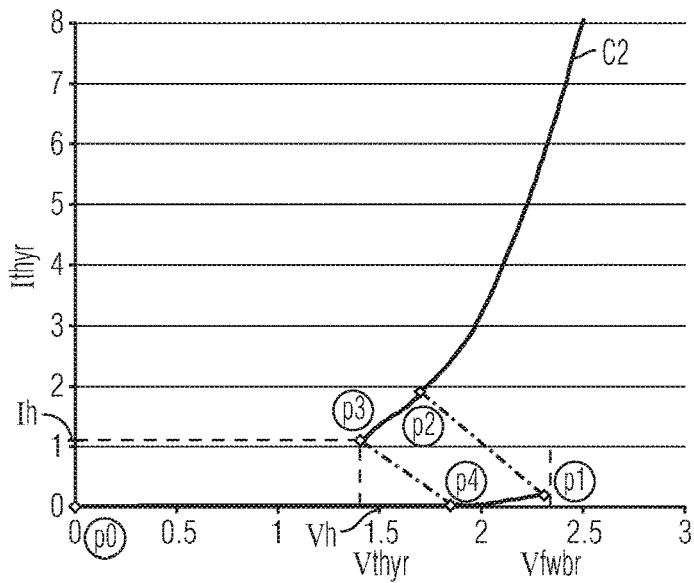
FIG. 7B schematically and exemplarily illustrates a hysteresis in the thyristor structure current-voltage diagram of FIG. 6B.
Figure 7C:
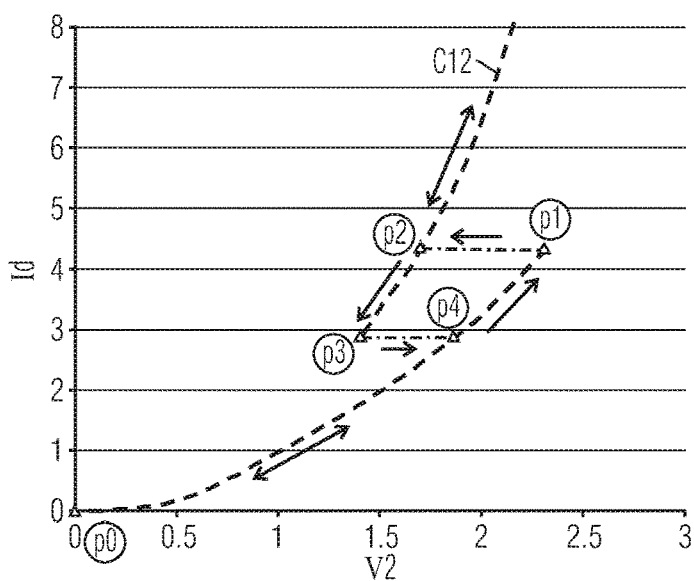
FIG. 7C schematically and exemplarily illustrates a hysteresis in the current-voltage diagram of FIG. 6C.
Figure 7D:
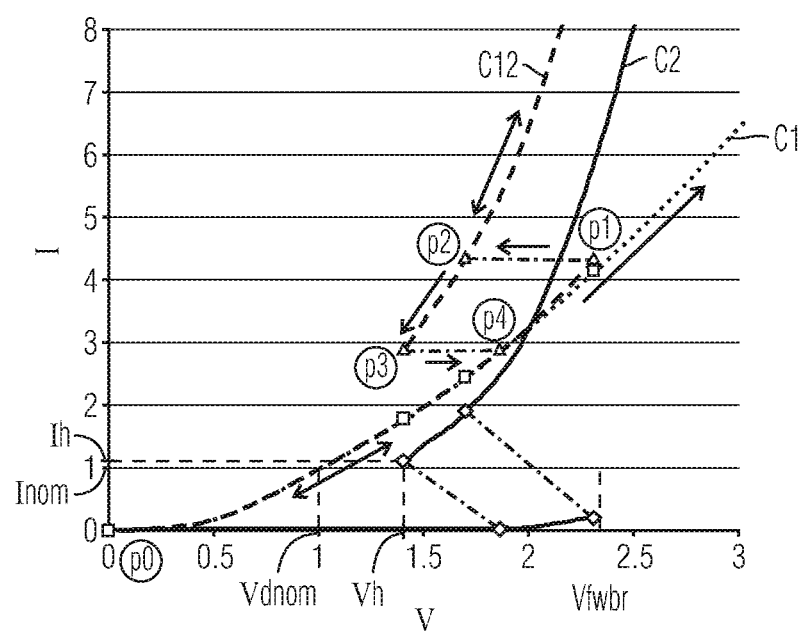
FIG. 7D shows the current-voltage curves of FIGS. 7A-C in one diagram.

FIGS. 7A-C each schematically and exemplarily illustrate a hysteresis in the corresponding current-voltage diagram of FIG. 6A-C. FIG. 7D shows the current-voltage curves C1, C2, C12 of FIGS. 7A-C in one diagram. In the following, the hysteresis will be explained mainly with reference to the curve C12 in FIG. 7C depicting the sum of the diode current Id and the thyristor current Ithyr (which may correspond essentially to the reverse current I2). For example, at an initial point p0 on the curve C12, the reverse current is zero. Then, between points p0 and p1 the reverse current I2 is ramped up (e. g. due to a surge current event), wherein the reverse current I2 essentially and continuously follows the diode characteristic C1 (cf. FIG. 7A). The reason is that, in this phase, the thyristor structure 40 is in its off-state and therefore essentially does not contribute to the conduction of the reverse current I2. At point p1, the thyristor voltage Vthyr reaches the forward breakover voltage Vfwbr (cf. C2 in FIG. 7B), and the thyristor structure 40 is suddenly switched on. As a consequence, a jump to point p2 occurs in the curve C12, wherein the thyristor structure suddenly takes over a large portion of the reverse current I2, thereby lowering the reverse voltage V2. This change happens on a very short time scale and is indicated as a dot-dashed line in FIG. 7C. From point p2 the current may increase continuously along the curve C12, as indicated by the arrow in FIG. 7C. At some point, the current will decrease again along the curve C12. When the thyristor current drops below the holding current Ih of the thyristor structure 40, which occurs at the point p3 in curve C12, the thyristor structure 40 turns off again, and the reverse voltage V2 suddenly increases from point p3 to point p4. Then, the reverse current I2 may continuously decrease further on the lower branch of the curve C12 (or may again increase on the lower branch of the curve C12 until it reaches point p1).

The hysteresis of the curve C12 illustrates that, in the reverse mode of the power electronic arrangement 1, the thyristor structure 40 conducts at most a very small fraction of the reverse current I2 if the reverse current I2 is relatively small. However, at large reverse currents I2, such as a reverse current amounting to, e. g., eight or ten times the nominal current Inom of the semiconductor switch structure 2, the thyristor structure 40 may support a considerable fraction of the reverse current I2, thus relieving the diode structure 3.

Figure 8:
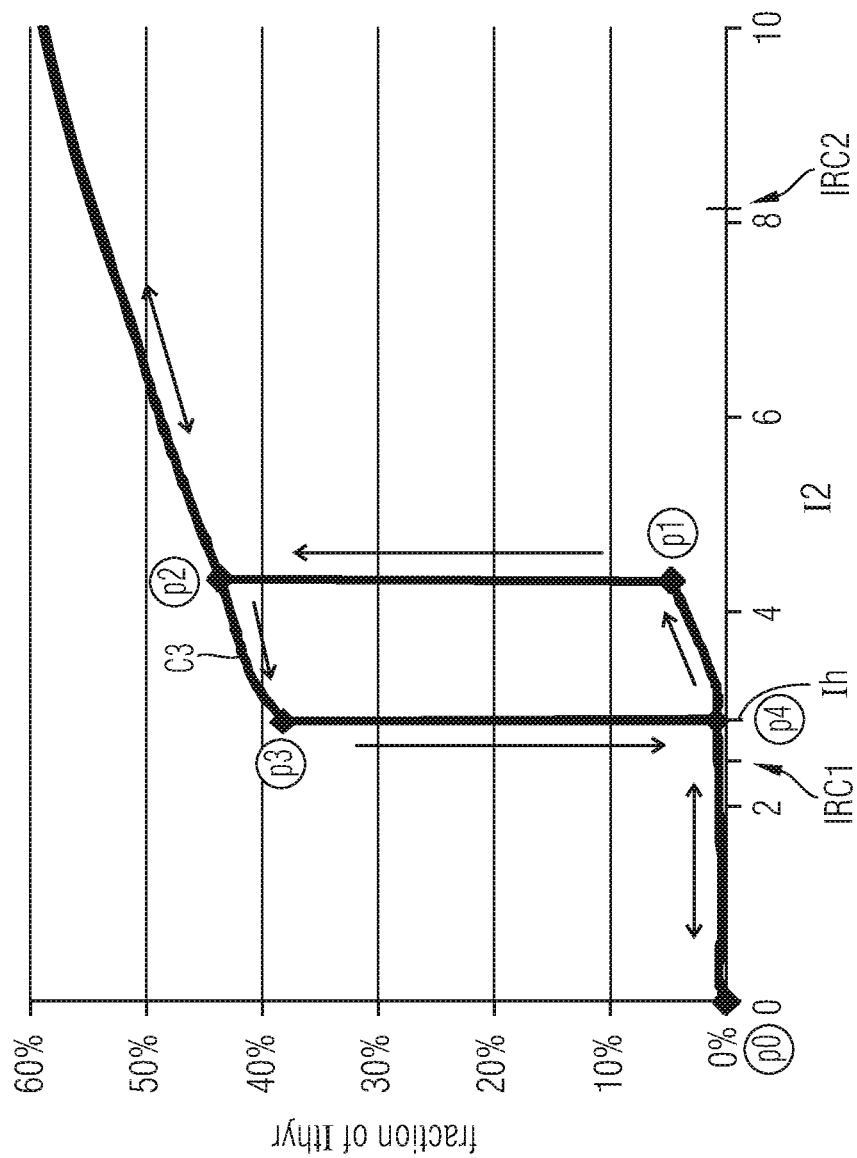
FIG. 8 schematically and exemplarily illustrates a hysteresis of a fraction of a thyristor current in a reverse current corresponding to the diagrams of FIGS. 7A-7D.

FIG. 8 schematically and exemplarily illustrates a hysteresis of the fraction of a thyristor current Ithyr in the reverse current I2, wherein the hysteresis including the points p1-p4 corresponds to the one illustrated in the diagrams of FIGS. 7A-7C. The curve C3 shows that the fraction of the thyristor current remains very small, such as below 10%, e. g., below 5% of the reverse current as long as the amount of the reverse current I2 is equal to or smaller than a first critical reverse current value IRC1. For example, the thyristor current may be essentially zero or limited to a small forward leakage current in this regime. For example, the first critical reverse current value IRC1 is smaller than the holding current Ih. As further illustrated in FIG. 8, the first critical reverse current value IRC1 may amount to at least twice, such as at least three times the nominal current Inom. Thus, the thyristor structure 40 may essentially not contribute to the conduction of the reverse current I2 under normal reverse conduction conditions when the amount of the reverse current I2 is on the order of the nominal current Inom.

On the other hand, the thyristor structure 40 may conduct a considerable fraction of the reverse current I2, such as, e. g., at least 20%, such as at least 30%, or even at least 40% of the reverse current I2, if the amount of the reverse current I2 is equal to or larger than a second critical reverse current value IRC2. As exemplarily illustrated, the second critical reverse current value IRC2 may be situated to the right of the points p1 and p2 in FIG. 8. In an embodiment, the second critical reverse current value IRC2 amounts to at most 10 times, such as, e. g., at most 5 times, the nominal current Inom. For example, the thyristor structure 40 may thus be configured for conducting a considerable part of the reverse current I2 only under typical surge current conditions. For example, the diode structure 3 may thus be relieved under surge current conditions. For example, a voltage drop at the diode structure 3 that would occur if the diode structure 3 (taken alone) had to support the second critical reverse current I2, may be larger than the forward breakover voltage Vfwbr of the thyristor structure 40.

With regard to thermal properties, the thyristor structure 40 may have a smaller thermal resistance and/or a larger thermal capacity than the diode structure 3. For example, an active area of the thyristor structure 40 may be at least as large as an active area of the diode structure 3. For example, the thyristor structure 40 may thus be configured for dissipating a large fraction of the power losses occurring under surge current conditions in the reverse mode of the power electronic arrangement. Regarding the term "active area", it should be noted that, e. g., in case the diode structure 40 is the body diode of a MOSFET, all of the active area of the MOSFET may, for example, be regarded as the relevant active area of the diode structure 3. An active area of the thyristor structure 40 may be defined, e. g. by the area of the thyristor cathode region(s) 106 if the thyristor structure 40 is monolithically integrated with an IGBT 20, as described above. Alternatively, in that case, the active area of the thyristor structure 40 may be defined as a projection of the thyristor cathode region(s) 106 to the front side 10-1 with a lateral spreading angle of, e. g. 45°. Thus, a lateral spreading of electrical and/or thermal currents may be taken into account.

In accordance with a further aspect of the invention, a power electronic module is provided, wherein the power electronic module comprises a plurality of power electronic arrangements 1 as described above. In an embodiment, the sum of active areas of the diode structures 3 of the power electronic arrangements 1 inside the power electronic module is in a range from 10% to 60%, such as, e. g., in a range from 30% to 50% of the sum of active areas of the semiconductor switch structures 2 of the power electronic arrangements inside the power electronic modules.

In the above, embodiments pertaining to a power semiconductor device, such as a diode, a MOSFET, or an IGBT, and corresponding processing methods were explained. For example, these devices are based on silicon (Si). Accordingly, a monocrystalline semiconductor region or layer, e. g., the semiconductor body 10 and its regions/zones 100, 100-1, 102, 103, 104, and 106 can be a monocrystalline Si-region or Si-layer. In other embodiments, polycrystalline or amorphous silicon may be employed.

It should, however, be understood that the semiconductor body 10 and its doped regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor device applications currently mainly Si, SiC, GaAs and GaN materials are used.

Spatially relative terms such as "under", "below", "above", "lower", "over", "upper" and the like, are used for ease of description to explain the positioning of one element relative to a second element. These terms are intended to encompass different orientations of the respective device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power electronic arrangement configured to conduct a forward current in a forward mode of the power electronic arrangement and to conduct a reverse current in a reverse mode of the power electronic arrangement, the power electronic arrangement comprising:
   a semiconductor switch structure configured to assume a forward conducting state, wherein a steady-state current carrying capability of the semiconductor switch structure in the forward conducting state is characterized by a nominal current, and wherein the semiconductor switch structure is configured to conduct, in the forward conducting state, at least a part of the forward current in the forward current mode of the power electronic arrangement;
   a diode structure electrically connected in antiparallel to the semiconductor switch structure and configured to conduct at least a part of the reverse current in the reverse mode of the power electronic arrangement; and
   a reverse-conducting structure monolithically integrated with the semiconductor switch structure,
   wherein in the reverse mode of the power electronic arrangement, the reverse-conducting structure conducts less than 10% of the reverse current if the amount of the reverse current is equal to or smaller than a first critical reverse current value, the first critical reverse current value amounting to at least the nominal current,
   wherein the reverse-conducting structure conducts at least 20% of the reverse current if the amount of the reverse current is equal to or larger than a second critical reverse current value, the second critical reverse current value amounting to at most 10 times the nominal current.

2. The power electronic arrangement of claim 1, wherein the first critical reverse current value amounts to at least twice the nominal current.

3. The power electronic arrangement of claim 1, wherein the reverse-conducting structure comprises a thyristor structure electrically connected in antiparallel to the semiconductor switch structure.

4. The power electronic arrangement of claim 3, wherein a forward breakover voltage of the thyristor structure is lower than a diode on-state voltage of the diode structure at a critical diode current value, and wherein the critical diode current value amounts to at most five times the nominal current.

5. The power electronic arrangement of claim 3, wherein in the in the reverse mode of the power electronic arrangement, the thyristor structure conducts less than 10% of the reverse current if the amount of the reverse current is equal to or smaller than a first critical reverse current value, and wherein the first critical reverse current value amounts to at least twice the nominal current.

6. The power electronic arrangement of claim 5, wherein in the in the reverse mode of the power electronic arrangement, the thyristor structure conducts at least 20% of the reverse current if the amount of the reverse current is equal to or larger than a second critical reverse current value, and wherein the second critical reverse current value amounts to at most 10 times the nominal current.

7. The power electronic arrangement of claim 3, wherein a holding voltage of the thyristor structure is higher than a diode forward voltage of the diode structure at the nominal current.

8. The power electronic arrangement of claim 3, wherein in the reverse mode of the power electronic arrangement, the diode structure is configured to conduct between the nominal current and four times the nominal current at a voltage equal to a holding voltage of the thyristor structure.

9. The power electronic arrangement of claim 3, wherein a reverse blocking voltage of the thyristor structure is higher than a forward breakover voltage of the thyristor structure.

10. The power electronic arrangement of claim 3, wherein a reverse blocking voltage of the thyristor structure amounts to at least 90% of a breakdown voltage of the diode structure.

11. The power electronic arrangement of claim 3, wherein the thyristor structure has a smaller thermal resistance than the diode structure and/or a larger thermal capacity than the diode structure.

12. The power electronic arrangement of claim 3, wherein an active area of the thyristor structure is at least as large as an active area of the diode structure.

13. The power electronic arrangement of claim 1, wherein the semiconductor switch structure is or comprises an IGBT.

14. The power electronic arrangement of claim 13, wherein the reverse-conducting structure comprises a thyristor structure electrically connected in antiparallel to the semiconductor switch structure, wherein the semiconductor switch structure and the thyristor structure are monolithically integrated in a power semiconductor device, the power semiconductor device comprising:
  a semiconductor body having a front side coupled to a first load terminal structure and a backside coupled to a second load terminal structure and configured to conduct the at least a part of the forward current between the first load terminal structure and the second load terminal structure; and
  a plurality of IGBT control cells arranged at the front side in contact with the first load terminal structure and at least partially included in the semiconductor body,
  wherein the semiconductor body comprises:
  a drift region of a first conductivity type arranged in contact with the IGBT control cells;
  a backside collector region of a second conductivity type complementary to the first conductivity type, the backside collector region arranged at the backside in contact with the second load terminal structure; and
  a thyristor cathode region of the first conductivity type arranged at the backside in contact with the second load terminal structure and isolated from the drift region by a semiconductor region of the second conductivity type.

15. The power electronic arrangement of claim 14, wherein a lateral extension of the thyristor cathode region defines a thyristor region of the semiconductor device, and wherein one or more of the IGBT control cells are arranged inside the thyristor region.

16. The power electronic arrangement of claim 14, wherein a lateral extension of the thyristor cathode region is equal to or smaller than twice a vertical extension of the semiconductor body.

17. The power electronic arrangement of claim 14, wherein the semiconductor body comprises a plurality of thyristor cathode regions distributed over a lateral extension of the semiconductor body.

18. A power electronic module comprising a plurality of power electronic arrangements of claim 1, wherein the sum of active areas of the diode structures is in a range from 10% to 60% of the sum of active areas of the semiconductor switch structures.

19. A power electronic arrangement configured to conduct a forward current in a forward mode of the power electronic arrangement and to conduct a reverse current in a reverse mode of the power electronic arrangement, the power electronic arrangement comprising:
  a semiconductor switch structure configured to assume a forward conducting state, wherein a steady-state current carrying capability of the semiconductor switch structure in the forward conducting state is characterized by a nominal current, and wherein the semiconductor switch structure is configured to conduct, in the forward conducting state, at least a part of the forward current in the forward current mode of the power electronic arrangement;
  a diode structure electrically connected in antiparallel to the semiconductor switch structure and configured to conduct at least a part of the reverse current in the reverse mode of the power electronic arrangement; and
  a thyristor structure electrically connected in antiparallel to the semiconductor switch structure,
  wherein a forward breakover voltage of the thyristor structure is lower than a diode on-state voltage of the diode structure at a critical diode current value,
  wherein the critical diode current value amounts to at most five times the nominal current.

20. The power electronic arrangement of claim 19, wherein the forward breakover voltage is equal to or smaller than 10 V.

21. The power electronic arrangement of claim 19, wherein the forward breakover voltage amounts to at least 3 V.

22. The power electronic arrangement of claim 19, wherein in the in the reverse mode of the power electronic arrangement, the thyristor structure conducts less than 10% of the reverse current if the amount of the reverse current is equal to or smaller than a first critical reverse current value, and wherein the first critical reverse current value amounts to at least twice the nominal current.

23. The power electronic arrangement of claim 19, wherein in the in the reverse mode of the power electronic arrangement, the thyristor structure conducts at least 20% of the reverse current if the amount of the reverse current is equal to or larger than a second critical reverse current value, and wherein the second critical reverse current value amounts to at most 10 times the nominal current.

24. The power electronic arrangement of claim 19, wherein the diode structure is monolithically integrated with the semiconductor switch structure.

25. The power electronic arrangement of claim 24, wherein the semiconductor switch structure comprises a MOSFET, and wherein a body diode of the MOSFET forms at least a part of the diode structure.

26. The power electronic arrangement of claim 25, wherein the MOSFET is a silicon carbide MOSFET.

27. The power electronic arrangement of claim 19, wherein a holding voltage of the thyristor structure is higher than a diode forward voltage of the diode structure at the nominal current.

28. The power electronic arrangement of claim 19, wherein in the reverse mode of the power electronic arrangement, the diode structure is configured to conduct between the nominal current and four times the nominal current at a voltage equal to a holding voltage of the thyristor structure.

29. The power electronic arrangement of claim 19, wherein a reverse blocking voltage of the thyristor structure is higher than a forward breakover voltage of the thyristor structure.

30. The power electronic arrangement of claim 19, wherein a reverse blocking voltage of the thyristor structure amounts to at least 90% of a breakdown voltage of the diode structure.

31. The power electronic arrangement of claim 19, wherein the diode structure is or comprises a silicon carbide diode.

32. The power electronic arrangement of claim 19, wherein the thyristor structure has a smaller thermal resistance than the diode structure and/or a larger thermal capacity than the diode structure.

33. The power electronic arrangement of claim 19, wherein an active area of the thyristor structure is at least as large as an active area of the diode structure.

34. The power electronic arrangement of claim 19, wherein the reverse-conducting structure comprises a Zener diode.

35. The power electronic arrangement of claim 19, wherein the semiconductor switch structure comprises a semiconductor body including a pn-junction configured to block a forward blocking voltage of the semiconductor switch structure in a forward blocking state of the semiconductor switch structure, wherein the semiconductor body is encased by a case, wherein the semiconductor switch structure has a junction-case thermal resistance Rthjc characterizing a steady-state heat transport capability between the pn-junction and the case, wherein the semiconductor switch structure is configured to operate continuously in the forward conducting state at a maximum junction temperature Tjmax of the pn-junction and a maximum operating case temperature Tc of the case, wherein the operation of the semiconductor switch structure in the forward conducting state at the maximum junction temperature Tjmax is characterized by a switch-structure on-state voltage Von, and wherein the nominal current Inom satisfies the following equation:

$$Von \cdot Inom = \frac{Tjmax - Tc}{Rthjc}.$$

36. The power electronic arrangement of claim 35, wherein a difference between the maximum junction temperature Tjmax and the maximum operating case temperature Tc is at least 50 K.

37. A power electronic module, comprising a plurality of power electronic arrangements of claim 19, wherein the sum of active areas of the diode structures is in a range from 10% to 60% of the sum of active areas of the semiconductor switch structures.

* * * * *

UNITED STATES PATENT AND TRADEMARK OFFICE
CERTIFICATE OF CORRECTION

PATENT NO. : 10,950,690 B2
APPLICATION NO. : 16/431337
DATED : March 16, 2021
INVENTOR(S) : F. Pfirsch et al.

Page 1 of 1

It is certified that error appears in the above-identified patent and that said Letters Patent is hereby corrected as shown below:

In the Claims

Column 14, Line 66 (Claim 5, Line 2), please change "in the in the" to --in the--
Column 15, Line 6 (Claim 6, Line 2), please change "in the in the" to --in the--
Column 16, Line 50 (Claim 22, Line 2), please change "in the in the" to --in the--
Column 16, Line 57 (Claim 23, Line 2), please change "in the in the" to --in the--

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*